(12) United States Patent
Liao et al.

(10) Patent No.: US 11,164,763 B2
(45) Date of Patent: *Nov. 2, 2021

(54) CARRIER TAPE SYSTEM AND METHODS OF USING CARRIER TAPE SYSTEM

(71) Applicant: Taiwan Semiconductor Manufacturing Co., Ltd., Hsinchu (TW)

(72) Inventors: Tsung-Jen Liao, Hsinchu (TW); Pei-Haw Tsao, Hsinchu (TW); Tsui-Mei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/869,473

(22) Filed: May 7, 2020

(65) Prior Publication Data

US 2020/0266082 A1    Aug. 20, 2020

Related U.S. Application Data

(62) Division of application No. 16/368,299, filed on Mar. 28, 2019, now Pat. No. 10,679,877.

(Continued)

(51) Int. Cl.
*H05K 13/02* (2006.01)
*B65H 5/28* (2006.01)
(Continued)

(52) U.S. Cl.
CPC ........ *H01L 21/67132* (2013.01); *C09J 7/201* (2018.01); *H01L 21/6836* (2013.01);
(Continued)

(58) Field of Classification Search
CPC ............. H05K 13/0084; H05K 13/021; H05K 13/0408; H05K 13/0417; H05K 13/0419; H01L 2221/68313
See application file for complete search history.

(56) References Cited

U.S. PATENT DOCUMENTS

| 6,315,156 B1 | 11/2001 | Mahoney et al. |
| 6,769,549 B2 | 8/2004 | Susaki |

(Continued)

FOREIGN PATENT DOCUMENTS

| CN | 101501155 A | 8/2009 |
| CN | 103224093 A | 7/2013 |

(Continued)

*Primary Examiner* — Mark A Osele
(74) *Attorney, Agent, or Firm* — Seed IP Law Group LLP

(57) ABSTRACT

The current disclosure describes carrier tape systems that include a carrier tape substrate and a cover tape. The carrier tape system includes a plurality of repetitive adhesion areas where the carrier tape substrate and cover tape are attached to each other and non-adhesion areas where the carrier tape substrate and cover tape are not attached to each other. Separating the cover tape and the carrier tape substrate at these repetitive adhesion and non-adhesion areas imparts a vibration to the cover tape which impedes or prevents semiconductor devices carried in pockets of the carrier tape substrate from adhering to adhesive on the cover tape.

20 Claims, 17 Drawing Sheets

Related U.S. Application Data

(60) Provisional application No. 62/691,503, filed on Jun. 28, 2018.

(51) Int. Cl.
*H01L 21/67* (2006.01)
*H01L 21/683* (2006.01)
*C09J 7/20* (2018.01)
*H05K 13/00* (2006.01)
*H05K 13/04* (2006.01)

(52) U.S. Cl.
CPC .... *H05K 13/0084* (2013.01); *C09J 2203/326* (2013.01); *C09J 2301/502* (2020.08); *H01L 2221/68313* (2013.01); *H01L 2221/68354* (2013.01); *H05K 13/0408* (2013.01); *H05K 13/0419* (2018.08)

(56) References Cited

U.S. PATENT DOCUMENTS

| | | | |
|---|---|---|---|
| 8,875,895 | B2 | 11/2014 | Sasamura et al. |
| 10,679,877 | B2* | 6/2020 | Liao .................... H01L 21/6836 |
| 2002/0005371 | A1 | 1/2002 | Susaki |
| 2002/0057958 | A1 | 5/2002 | Eschenweck et al. |
| 2006/0138019 | A1 | 6/2006 | Yoshii et al. |
| 2006/0157382 | A1 | 7/2006 | Yasufuku et al. |
| 2007/0074996 | A1 | 4/2007 | Nice et al. |
| 2015/0108038 | A1 | 4/2015 | Hsu et al. |

FOREIGN PATENT DOCUMENTS

| | | |
|---|---|---|
| CN | 104648816 A | 5/2015 |
| CN | 106604878 A | 4/2017 |
| JP | 2002-96868 A | 4/2002 |

* cited by examiner

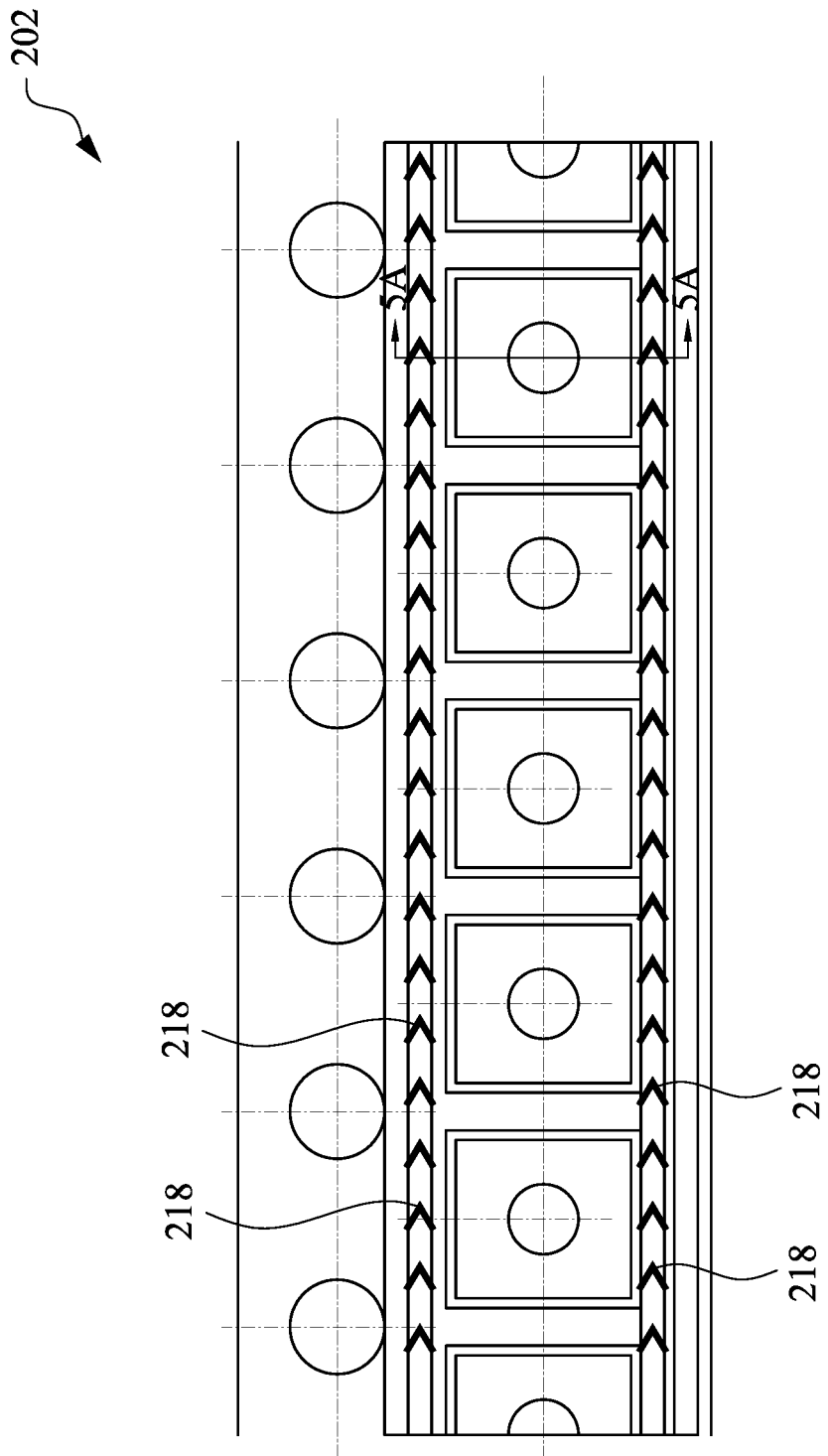

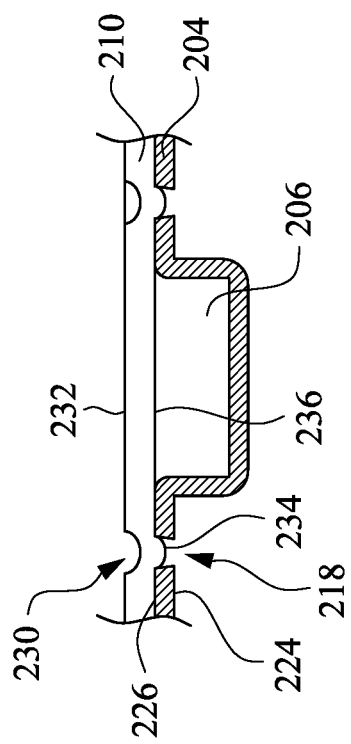

CARRIER TAPE SYSTEM AND METHODS OF USING CARRIER TAPE SYSTEM

BACKGROUND

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level chip scale packaging (WLCSP) is widely used for its low cost and relatively simple manufacturing operations. During the WLCSP operation, a number of semiconductor components are assembled on a semiconductor device.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIG. 5A illustrates a top view of a carrier tape system according to embodiments of the present disclosure;

FIG. 6 illustrates an enlarged cross-section view of a carrier tape system illustrating an alternative non-adhesion area according to embodiments of the present disclosure;

DETAILED DESCRIPTION

Figure 1:
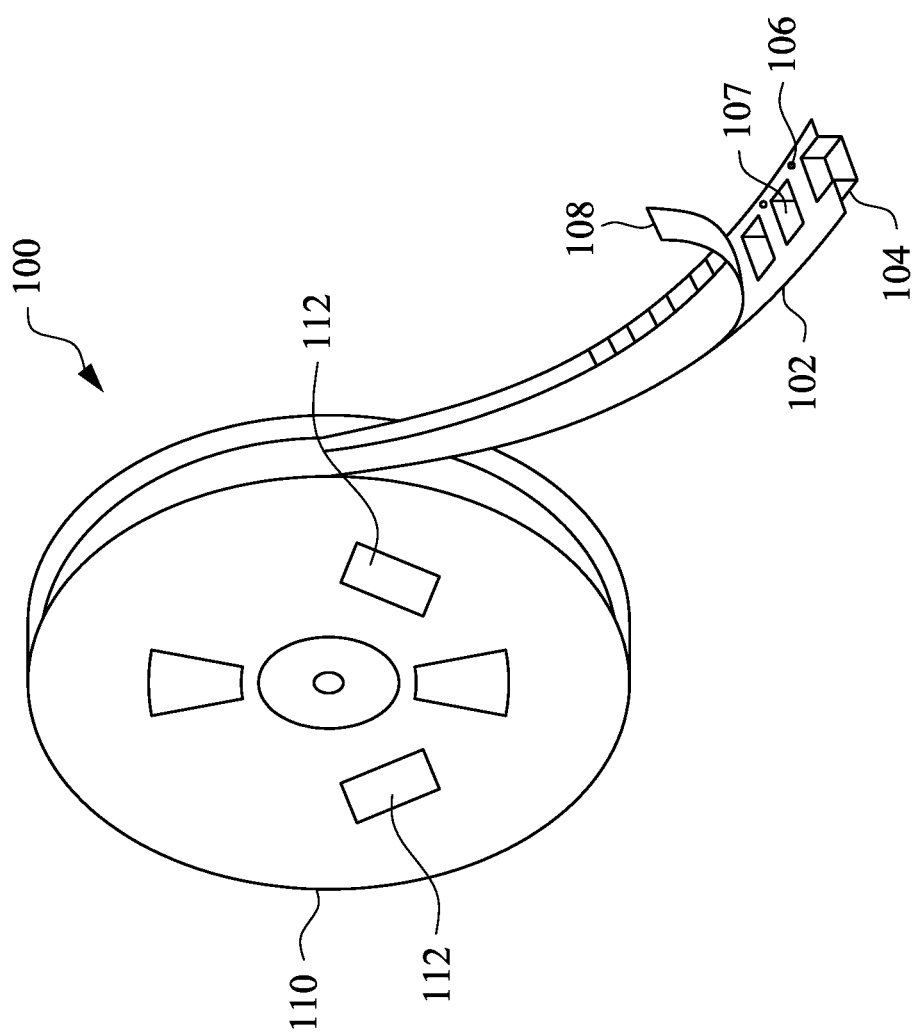
FIG. 1 illustrates an example tape and reel packaging system.

Semiconductor devices are shipped to customers in various packaging configurations. One example of semiconductor device shipping is based on tape and reel packaging systems. In the tape and reel format, components are placed in specifically designed pockets embossed in a carrier tape body. The pockets may be sealed with a cover tape to hold components placed in the pockets. Sprocket holes may be provided along one or both margins of the carrier tape to enable the tape to be moved by automated equipment. The tape is wound onto a plastic reel for labeling and packaging before shipment.

Techniques and structures in accordance with embodiments described herein are directed to novel carrier tape systems for semiconductor devices, cover tapes for use in embodiments of cover tape systems described herein, carrier tapes for use in embodiments of carrier tape systems described herein and methods for supplying semiconductor devices to an apparatus, which in operation, removes semiconductor devices from pockets of a carrier tape system, and in some embodiments places the semiconductor devices at desired locations. Embodiments of carrier tape systems, cover tapes, carrier tapes and methods for supplying semiconductor devices in accordance with the present disclosure experience fewer problems than conventional carrier tape systems, cover tapes, carrier tapes and methods for supplying semiconductor devices with regard to semiconductor devices adhering to a cover tape when the cover tape is removed from a carrier tape in advance of the semiconductor device being removed from a pocket of the carrier tape system.

Cover tape systems in accordance with embodiments described herein include a carrier tape that includes a plurality of pockets for receiving semiconductor devices. The pockets include an opening through which the semiconductor device is passed when a semiconductor device is placed in a pocket. The disclosed cover tape systems include a cover tape including a covering portion positioned directly over the opening when the cover tape and carrier tape are mated. The cover tape and carrier tape are mated together using an adhesive positioned between the cover tape and portions of the carrier tape around the opening, e.g., along at least a sealing line which runs along the length of the carrier tape system. In accordance with embodiments described herein, the carrier tape system includes a plurality of non-adhesion areas where the cover tape and the carrier tape are not secured to each other by an adhesive or other means. In example embodiments these non-adhesion areas are provided along the sealing line between the carrier tape and the cover tape. In some embodiments, the non-adhesion areas are free of adhesive or include adhesive that has been covered with a release material that does not adhere to the carrier tape or the cover tape. In other embodiments, the non-adhesion areas include openings or recesses formed in the carrier tape such that adhesive on portions of the cover tape that overlap such openings or recesses has no carrier tape surface to which to adhere. In some embodiments, the non-adhesion areas are located between the plurality of pockets and at least one of a first edge, e.g., a longitudinal edge, of the carrier tape and/or a second edge, e.g., a longitudinal edge, of the carrier tape. The non-adhesion areas result in improved performance of carrier tape systems of the present disclosure with respect to reducing occurrences of adhesion between the cover tape and a semiconductor device packaged in a pocket.

In some embodiments, the non-adhesion areas include an opening that passes through the carrier tape substrate from an upper surface of the carrier tape substrate to a lower surface of the carrier tape substrate or a recess (which does not pass completely through the carrier tape substrate) in a surface of the carrier tape substrate. These openings or recesses create voids in a surface of the carrier tape substrate. When a cover tape is mated with a carrier tape substrate including such openings or recesses, cover tape adhesive that overlaps these openings or recesses has no carrier tape substrate surface to which to adhere, thus providing a non-adhesion area where there is no adhesion between the carrier tape substrate and the cover tape. In other words, the cover tape and carrier tape substrate are not adhered to each other at the opening or recess. In some embodiments, a row of non-adhesion areas is provided on opposite sides of the plurality of pockets in the carrier tape substrate and run along the length dimension of the carrier tape substrate. In accordance with embodiments of the present disclosure, each of the non-adhesion areas is separated from another non-adhesion area by an adhesion area which includes adhesive securing a portion of the carrier tape substrate to a portion of the cover tape. In certain embodiments of the present disclosure, the carrier tape system includes a cover tape that includes a plurality of protrusions which mate with non-adhesion areas formed in a carrier tape substrate, e.g., openings or recesses in the carrier tape substrate.

Carrier tape systems in accordance with embodiments described herein are utilized in a method for supplying semiconductor devices to an apparatus, which in operation, removes the semiconductor devices from a pocket of the carrier tape system. Such methods include separating a cover tape from a carrier tape substrate at one or more of a plurality of non-adhesion areas of the cover tape system. In accordance with some embodiments the non-adhesion areas are of adhesive and in other embodiments the non-adhesion areas are opening or recesses formed in the carrier tape substrate. In some embodiments of the disclosed methods, the non-adhesion areas and adhesion areas are located between a plurality of pockets of the carrier tape substrate and at least one of a longitudinal first edge or a longitudinal second edge of the carrier tape substrate.

Providing carrier tape systems in accordance with embodiments described herein, which include non-adhesion areas along the sealing line between a cover tape and a carrier tape substrates results in improved performance of carrier tape systems of the present disclosure with respect to reducing occurrences of adhesion between the cover tape and a semiconductor device packaged in the carrier tape systems. In accordance with embodiments described herein, as the cover tape and carrier tape substrate of carrier tape systems in accordance with embodiments of the present disclosure are separated, the repeated separation at non-adhesion areas and adhesion areas causes the cover tape to vibrate at a frequency related to the frequency with which separation at the non-adhesion areas and adhesion areas occurs. Such vibration impedes or prevents semiconductor devices in the pockets from becoming adhered to the cover tape.

Cover tapes in accordance with embodiments described herein include a cover tape base material and an adhesive layer on the cover tape base material. In accordance with embodiments described herein, the adhesive layer includes a plurality of adhesion areas occupied by an adhesive, and a plurality of non-adhesion areas substantially free of adhesive or which include adhesive covered by a release material which does not adhere to the carrier tape substrate. In some embodiments, when such cover tapes are mated with a carrier tape substrate to form carrier tape systems in accordance with the present disclosure, the non-adhesion areas are located between a plurality of pockets of the carrier tape substrate and at least one of a first longitudinal edge of the carrier tape substrate and a second longitudinal edge of the carrier tape substrate. Providing a cover tape with such non-adhesion areas results in improved performance of carrier tape systems of the present disclosure with respect to reducing occurrences of adhesion between the cover tape and a semiconductor device packaged in cover tape systems in accordance with the present disclosure.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of such figures or a device in use or operation in addition to the orientation depicted in the figures. The features or device or apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques and tape and reel systems have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a schematic illustration of a tape and reel packaging system 100. The tape and reel packaging system 100 comprises a carrier tape 102 and a cover tape 108 which forms a carrier tape system in accordance with the present disclosure. Exemplary materials for carrier tapes include plastic materials, for example polycarbonate, polystyrene or polyethylene terephthalate. The present disclosure is not limited to carrier tapes made from polycarbonate, polystyrene, or polyethylene terephthalate. Embodiments of the present disclosure can be applied to carrier tapes made from materials other than polycarbonate, polystyrene or polyethylene terephthalate. Carrier tape 102 can exhibit varying conductive and anti-static qualities to suit different applications; however, the present disclosure is not limited to carrier tapes that exhibit conductive or antistatic qualities. Carrier tape 102 includes pockets 104 for housing a component, e.g., a semiconductor device such as a surface mount device (207 in FIG. 2A). Pockets 104 may be embossed into the carrier tape 102, for example, or may be formed in other ways that do not involve embossing. Pockets 104 may be polygonal in shape, e.g., square, rectangular, pentagonal, hexagonal and the like, or they may be non-polygonal in shape, e.g., round or oval. Pockets 104 include openings 107 through which a component is passed when the component is placed in a pocket. Sprocket holes 106 are provided along one or both margins of a top surface of the carrier tape 102. The sprocket holes 106 enable precise detection of the pockets 104 by a pick and place unit which is an example of an apparatus for removing components from carrier tape 102 and placing the removed components at desired locations. For example, the pick and place unit includes a needle or feeder sprocket configured to engage the sprocket holes 106 thereby registering the pickup head relative to the carrier tape. The pockets 104 are sealed with a cover tape 108 to hold in place components placed in the pockets 104. In accordance with examples of the present disclosure, a cover tape includes an adhesive layer that includes a heat-activated adhesive (HAA) or a pressure-sensitive adhesive (PSA). Polyethylene is an example of an adhesive material that can be used as a primary component of a cover tape adhesive; however, embodiments of the present disclosure are not limited to using a cover tape adhesive having polyethylene as a primary component, cover tape adhesives containing other polymeric material as a major component can be used as a cover tape adhesive in accordance with the present disclosures. Embodiments in accordance with the present disclosure are not limited to cover tapes that utilize an HAA or PSA adhesive, e.g., embodiments of the present disclosure are applicable to cover tapes that utilize adhesives that are not HAA or PSA. In a taping process in which a cover tape 108 including an HAA is mated with a carrier tape 102, a heated sealing shoe presses the cover tape 108 onto the edges of the carrier tape 102, thereby sealing the cover tape 108 to the carrier tape 102 along a sealing line. In an HAA taping process, time, heat, and pressure are controlled for achieving optimum adhesion. After cooling, if the temperature of the HAA is increased after the taping process, the HAA may soften and increase in tackiness/stickiness. In the taping process in which a cover tape 108 including a PSA is mated with a carrier tape 102, the cover tape adheres when pressure is applied. Heat may be not required to activate the bond when a PSA is used. In some embodiments, the PSA remains sticky even after the cover tape 108 has been mated with the carrier tape 102. When the HAA or PSA is sticky and the semiconductor device in the pocket contacts such sticky adhesive, the semiconductor device may stick to the HAA or PSA. Sticking of the semiconductor device to the cover tape can also occur through the presence of adhesive residue that is present on a surface of the semiconductor device face the cover tape 108. Such adhesive residue can originate from processing of the semiconductor device prior to packaging the semiconductor device in the carrier tape 102. The carrier tape 102 sealed to the cover tape 108 by the adhesive is wound onto a reel 110. Labels 112 may be placed on the reel 110 comprising any kind of information, for example customer name, device part number, product date code, and quantity in the reel. Bar codes may be part of the labels.

Figure 2A:
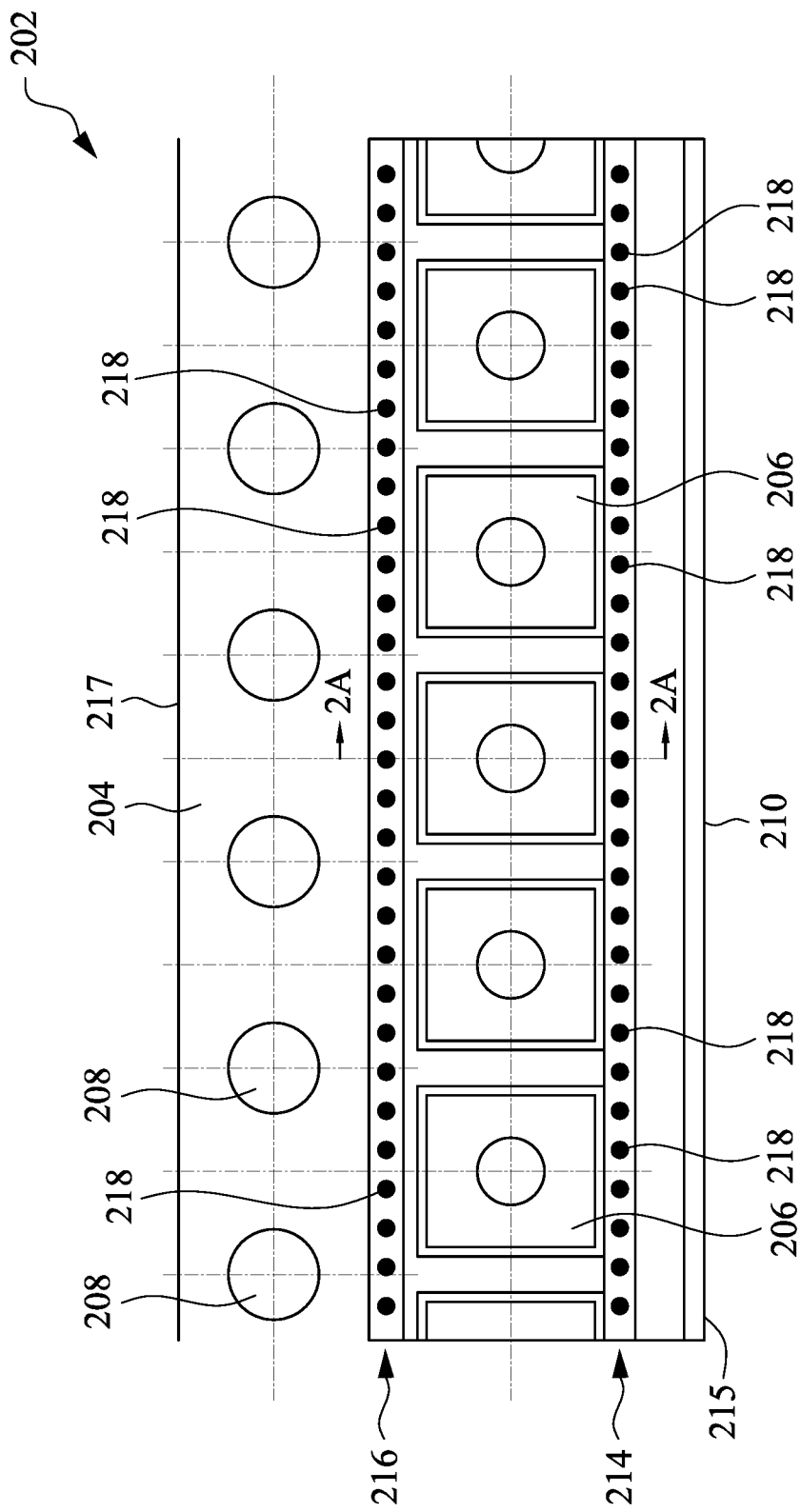
FIG. 2A illustrate a top view of a carrier tape system according to embodiments of the present disclosure.
Figure 2C:
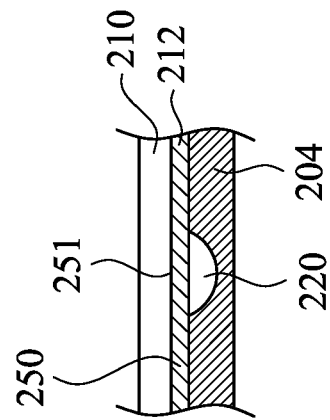
FIG. 2C illustrates an enlarged cross-section view of an alternative non-adhesion area in accordance with embodiments of the present disclosure.
Figure 2B:
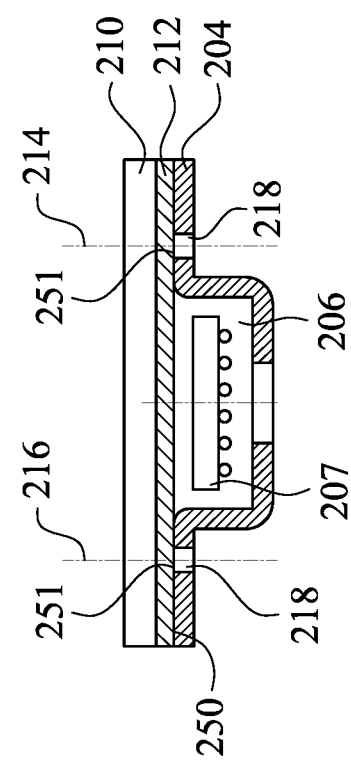
FIG. 2B illustrates an enlarged cross-section view of the carrier tape system of FIG. 2 along line 2A-2A.

FIGS. 2A 2B show an enlarged view of the top of a carrier tape system 202 (FIG. 2A) and FIG. 2B shows a cross-section of carrier tape system 202 taken along line 2A-2A in FIG. 2A. Carrier tape system 202 includes a carrier tape substrate 204 which includes a plurality of pockets 206 for receiving semiconductor devices and a plurality of sprocket holes 208. In order to improve clarity, semiconductor devices have been omitted from the plurality of pockets 206. The plurality of pockets 206 are aligned in a row along a length dimension of the carrier tape system 202 and the plurality of sprocket holes 208 are aligned in a row along the length dimension of carrier tape system 202. Carrier tape system 202 further includes a cover tape 210 overlying carrier tape substrate 204. A portion of the underside of cover tape 210 is adhered to a portion of the topside of carrier tape substrate 204 at adhesion areas 250 by an adhesive (see adhesive 212 in FIGS. 2B-2D) between cover tape 210 and carrier tape substrate 204. In accordance with some embodiments, carrier tape substrate 204 and cover tape 210 are adhered to each other along a sealing line 214 and a sealing line 216 shown in FIGS. 2A and 2B. Embodiments of the present disclosure are not limited to adhering carrier tape substrate 204 and cover tape 210 along sealing lines 214 and 216. For example, carrier tape substrate 204 and cover tape 210 can be adhered to each other by an adhesive at locations outside of sealing lines 214 and 216. In the embodiment illustrated in FIG. 2A, sealing line 214 and sealing line 216 are located on opposite sides of pockets 206 and are arranged in rows extending along the length dimension of carrier tape system 202. Sealing line 214 is located between the row of the plurality of pockets 206 and a first longitudinal edge 215 of carrier tape system 202 and sealing line 216 is located between the row of the plurality of pockets 206 and the row of sprocket holes 208. The row of sprocket holes 208 are located between the plurality of pockets 206 and a second longitudinal edge 217. In accordance with embodiments illustrated in FIGS. 2A and 2B, carrier tape substrate 204 includes a plurality openings 218 that pass through carrier tape substrate 204 and define non-adhesion areas 251 of carrier tape system 202 of FIGS.

2A and 2B. Openings 218 result in voids in carrier tape substrate 204 to which adhesive on cover tape 210 cannot adhere. Thus, in accordance with embodiments illustrated in FIGS. 2A and 2B, areas of non-adhesion 251 between cover tape 210 and carrier tape substrate 204 exist at openings 218. These non-adhesion areas 251 are separated from each other by areas of adhesion 250 (corresponding to areas of carrier tape substrate 204 which remain after openings 218 have been formed) where adhesive on cover tape 210 is able to contact a portion of carrier tape substrate 204. Openings 218 are formed in carrier tape substrate 204 by punching or similar technique. Openings 218 are formed at the same time pockets 206 are formed in carrier tape substrate 204 or may be formed at a time different from when pockets 206 are formed in carrier tape substrate 204. The size of openings 218 can vary; however, the size of openings 218 are not be so large that openings 218 overlap pockets 206 and either sprocket holes 208 or a longitudinal edge of carrier tape substrate 202. When openings 218 are round, their diameter can range from about 1 μm to 1500 μm; however, openings 218 can have a diameter that is less than 1 μm and greater than 1500 μm. By comparison, in some embodiments, pockets 206 have length and width dimensions that are on the order of one to two or more orders of magnitude larger than the diameter of openings 218. For example, as illustrated in FIGS. 2A, 3A, 4A and 5A, more than one of the first plurality of non-adhesion areas 218 are adjacent each of the plurality of pockets 206. In some embodiments, the depth of pockets 206 can be 2 to 10 or more times the diameter of openings 218. In some embodiments, sprocket holes 208 include diameters that are 3 to 5 or more times larger than the diameter of openings 218.

In operation, cover tape 210 is separated from carrier tape 204 by overcoming the bond between cover tape 210 and carrier tape 204 created by the adhesive 212. Such separation is achieved by causing cover tape 210 and carrier tape 204 to move in substantially opposite directions with sufficient force to overcome the adhesion provided by adhesive 212. When cover tape 210 and carrier tape 204 move in substantially opposite directions with sufficient force to overcome the adhesion of adhesive 212, they separate from each other in adhesion areas 250. When the separating cover tape 210 and carrier tape 204 encounter a non-adhesion area 251 the absence of adhesion between cover tape 210 and carrier tape 204 at the non-adhesion area 251 in combination with the force being applied to separate cover tape 210 from carrier tape 204 results in the cover tape vibrating. The frequency at which the cover tape vibrates as it is separated from the carrier tape at the alternating adhesion areas 250 and non-adhesion areas 251 in accordance with embodiments described herein depend in part on the rate at which the cover tape is separated from the carrier tape (e.g., in mm/min) and the distance between adjacent non-adhesion areas. The spacing between adjacent openings 218 can vary. In accordance with disclosed embodiments, spacing between adjacent openings 218 ranges between 1 μm and 1500 μm; however, the spacing between adjacent openings 218 is not limited to this range and the spacing can be less than 1500 μm or greater than 1 μm. The spacing between adjacent openings 218 can be chosen so that the vibration imparted to the cover tape as it is separated from the carrier tape is between 1 Hz and 1000 Hz. The frequency at which the cover tape vibrates as it is separated from the carrier tape in accordance with embodiments described herein will depend on the rate at which the cover tape is separated from the carrier tape (e.g., in mm/min) and the distance between adjacent non-adhesion areas. The vibration of the cover tape may also be affected by the alignment of openings 218 of seal line 214 and seal line 216. For example, openings 218 that are bisected by line 2A-2A in FIG. 2A are aligned along a width direction of the carrier tape substrate. In other embodiments, openings 218 of seal line 214 are not aligned with openings 218 of seal line 216 with respect to the width direction of the carrier tape substrate. Such misalignment will affect the vibration of the cover tape as it is separated from the carrier tape substrate.

Referring to FIG. 2C, an alternative embodiment of a non-adhesion area is illustrated whereby a recess 220, which does not pass completely through carrier tape substrate 204 is provided in an upper surface of carrier tape substrate 204 which is adjacent cover tape 210. Similar to opening 218, recess 220 produces a void in a surface of carrier tape substrate 204 to which adhesive on a portion of carrier tape 210 that overlaps recess cannot adhere. Recesses 220 are formed in carrier tape substrate 204 by punching, embossing or similar technique. Recesses 220 are formed at the same time pockets 206 are formed in carrier tape substrate 204 or may be formed at a time different from when pockets 206 are formed in carrier tape substrate 204. When recess 220 is round, it's diameter measured at an upper surface of carrier tape substrate 204 can range from about 1 μm to about 1500 μm; however, recess 220 can have a diameter at an upper surface of carrier tape substrate 204 that is less than 1 μm and greater than 1500 μm. Recess 220 is not so deep that it extends completely through carrier tape substrate 204, and thus, the depth of recess 220 is less than the thickness of carrier tape substrate 204. In some embodiments, recess 220 is about 5 to 15 microns deep.

Figure 2E:
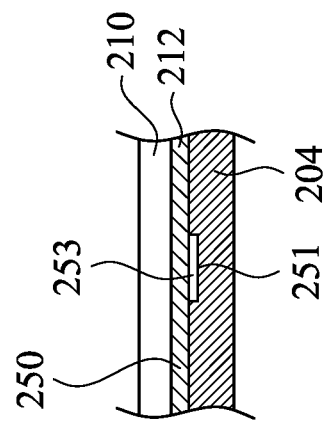
FIG. 2E illustrates an enlarged cross-section view of an alternative non-adhesion area according to embodiments of the present disclosure.
Figure 2D:
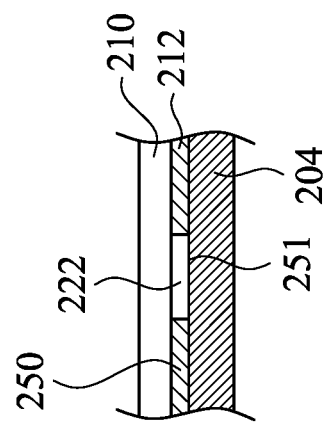
FIG. 2D illustrates an enlarged cross-section view of an alternative non-adhesion area according to embodiments of the present disclosure.

Referring to FIG. 2D, an alternative embodiment of a non-adhesion area 251 is illustrated. In the illustrated embodiment, non-adhesion area 251 results due to the layer of adhesive 212 between carrier tape substrate 204 and cover tape 210 being patterned to include portions 222 that are free of adhesive or as illustrated in FIG. 2E which include adhesive that has been covered by a release material 253 (see FIG. 2E) that does not adhere to either the carrier tape substrate 204 or the cover tape 210. Adhesive layer 212 can be patterned using techniques analogous to photolithography or by printing the adhesive on either the cover tape 210 or carrier tape substrate 204 in a desired pattern to provide adhesive-free portions 222. Suitable release materials may include polyethyelene terephthalate (PET) and the like. The release materials can be provided on portions of the adhesive layer by printing the release material on the adhesive layer in a desired pattern or other similar printing, or patterning techniques.

Figure 3A:
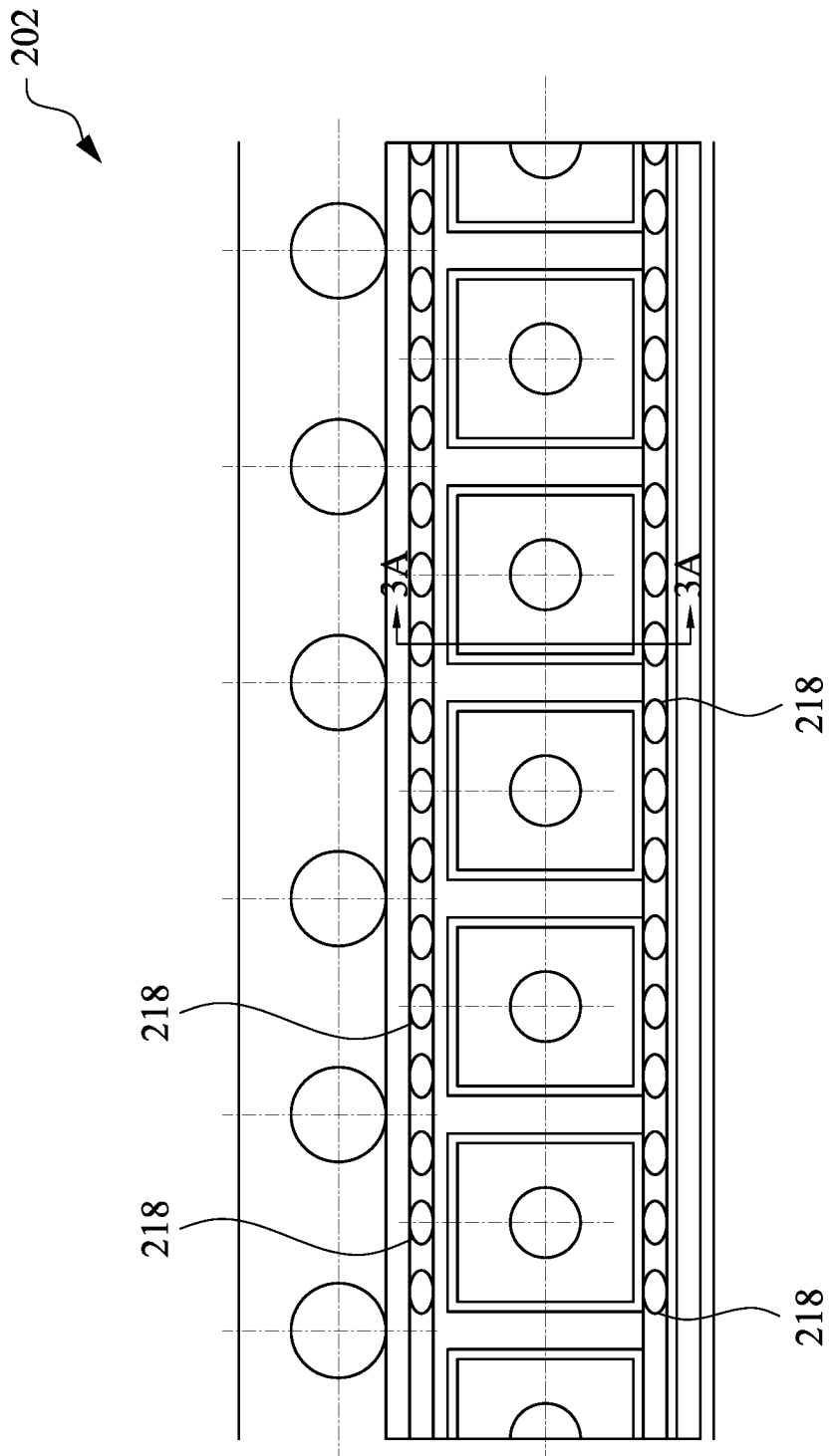
FIG. 3A illustrates a top view of a carrier tape system according to embodiments of the present disclosure.
Figure 3C:
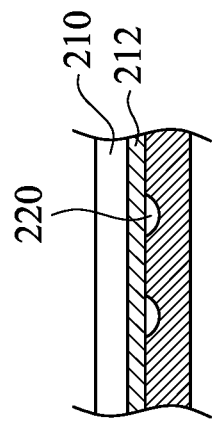
FIG. 3C illustrates an enlarged cross-section view of an alternative non-adhesion area according to embodiments of the present disclosure.
Figure 3B:
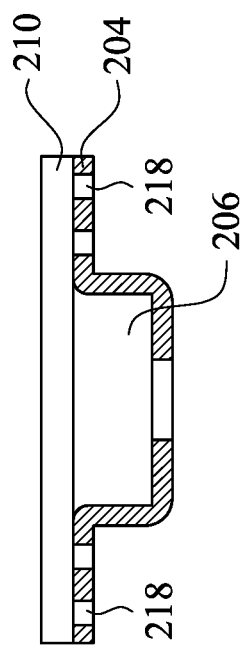
FIG. 3B illustrates an enlarged cross-section view of the carrier tape system of FIG. 3 along line 3A-3A.

Referring to FIGS. 3A, 3B and 3C, alternative embodiments of shapes for openings 218 and recesses 220 are illustrated. In the embodiments of FIGS. 3A, 3B and 3C openings 218 and recesses 220 are annular in shape. Other features of a carrier tape system 202 illustrated in FIGS. 3A, 3B and 3C are similar to or identical to the features of carrier tape system 202 described with reference to FIGS. 2A, 2B and 2C and thus, the description of these features with reference to FIGS. 2A, 2B and 2C applies to those same features in FIGS. 3A, 3B and 3C. In accordance with embodiments described herein with reference to FIGS. 3A, 3B and 3C, a non-adhesion area is provided in the same manner as described above with reference to FIG. 3D, namely, by providing a layer of adhesive 212 between carrier tape substrate 204 and cover tape 210 that includes portions 222 in an annular shape that are free of adhesive or which include adhesive that has been covered by a release material (not shown) that does not adhere to either the carrier tape substrate 204 or the cover tape 210.

Figure 4A:
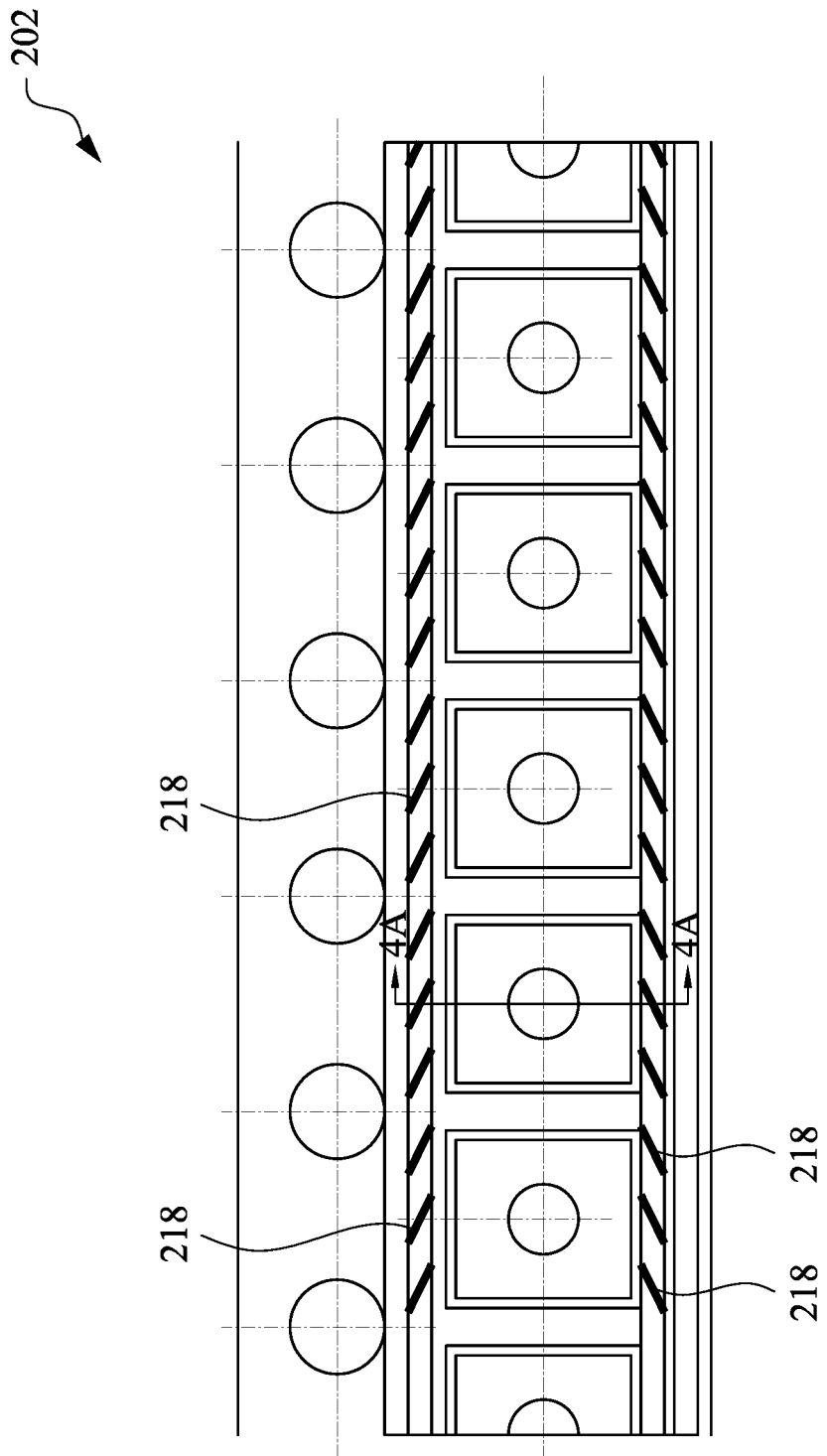
FIG. 4A illustrates a top view of a carrier tape system according to embodiments of the present disclosure.
Figure 4B:
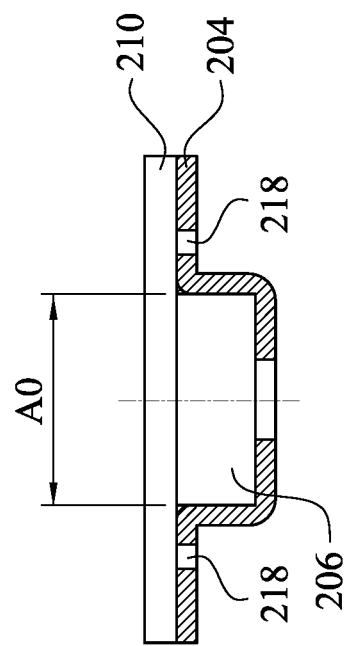
FIG. 4B illustrates an enlarged cross-section view of the carrier tape system of FIG. 4 along line 4A-4A.

Referring to FIGS. 4A and 4B, alternative embodiments of shapes for openings 218 are illustrated. In the embodiments illustrated in FIGS. 4A and 4B, openings 218 are elongated rectangles or ovals arranged at an oblique angle relative to the longitudinal edges of carrier tape system 202. Though not illustrated, in other embodiments of the present disclosure, recesses 220 that are elongated rectangles or ovals in shape and arranged at an oblique angle relative to the longitudinal edges of carrier tape system 202 are contemplated by the present disclosure. Similarly, a non-adhesion area can be provided in the same manner as described above with reference to FIG. 3D, namely, by providing a layer of adhesive 212 between carrier tape substrate 204 and cover tape 210 that include portion 222 that are rectangular or oval in shape and arranged at an oblique angle relative to a longitudinal edge of the carrier tape substrate 204 and are free of adhesive or which include adhesive that has been covered by a release material (not shown) that does not adhere to either the carrier tape substrate 204 or the cover tape 210.

Figure 5B:
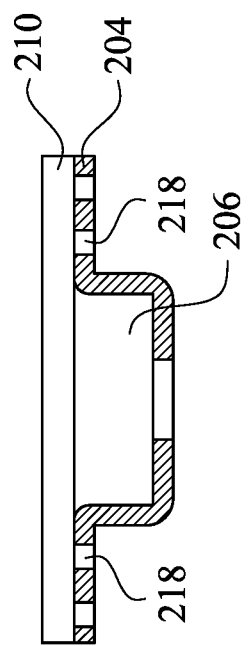
FIG. 5B illustrates an enlarged cross-section view of the carrier tape system of FIG. 5 along line 5A-5A.

Referring to FIGS. 5A and 5B, alternative embodiments of shapes of openings 218 are illustrated. In the embodiments illustrated in FIGS. 5A and 5B, openings 218 are arrowhead-shaped. Though not illustrated, in other embodiments of the present disclosure, recesses 220 that are arrowhead-shaped are contemplated by the present disclosure. Similarly, a non-adhesion area can be provided in the same manner as described above with reference to FIG. 3D, namely, by providing a layer of adhesive 212 between carrier tape substrate 204 and cover tape 210 that includes portions 222 that are arrowhead-shaped and free of adhesive or which include adhesive that has been covered by a release material (not shown) that does not adhere to either the carrier tape substrate 204 or the cover tape 210.

Referring to FIG. 6, in accordance with other embodiments, carrier tape substrate 204 includes openings 218 which pass from a lower surface 224 to an upper surface 226 of carrier tape substrate 204. In the embodiments illustrated in FIG. 6, the size of opening 218 at lower surface 224 is smaller than the size of opening 218 at upper surface 226 of carrier tape substrate 204. Though not illustrated in FIG. 6, opening 218 can also be a recess 220, which does not extend completely through carrier tape substrate 204 from upper surface 226 to lower surface 224. In such embodiments, the size of recess 220 at upper surface 226 is greater than the size of recess 222 below upper surface 226. In addition, in the embodiment illustrated in FIG. 6, cover tape 210 includes a recess 230 in its upper surface 232 and a protrusion 234 in its lower surface 236. In accordance with some embodiments, protrusion 234 is sized and located so that it mates with and at least a portion of protrusion 234 is received within opening 218 (or recess 220 not shown in FIG. 6) at upper surface 226 of cover tape 210. The presence of protrusions 234 assists with alignment of cover tape 210 and carrier tape substrate 204.

Figure 7:
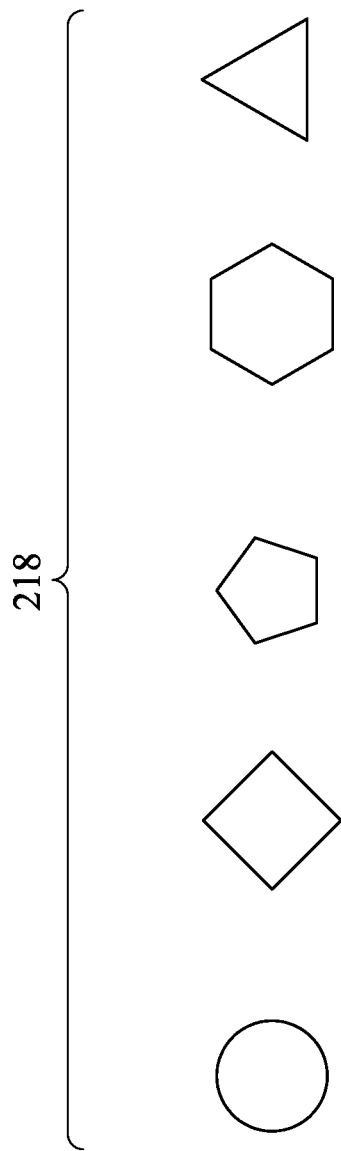
FIG. 7 illustrates alternative shapes for openings forming a part of non-adhesion areas according to embodiments of the present disclosure.

Openings 218 in FIG. 2A are illustrated as being round; however, embodiments in accordance with the present disclosure are not limited to openings 218 that are round. For example, FIG. 7 illustrates a plurality of different shapes for openings 218, including square, pentagonal, hexagonal and triangular shapes. FIG. 7 illustrates a top view of five different shapes for opening 218, including a round opening as illustrated in FIG. 2A. As described above, these different shapes of openings 218 extend completely through carrier tape substrate 204 or they may not extend completely through carrier tape substrate 204, in which case they form a recess 220 in carrier tape substrate 204. Additionally, as illustrated in FIG. 6, the size of opening 218 can change as opening 218 extends through carrier substrate 204. In FIG. 6, opening 218 is illustrated as becoming smaller in size as opening 218 extends from upper surface 226 to lower surface 224; however, embodiments of the present disclosure are not limited to opening 218 or recess 220 decreasing in size as it extends from upper surface 226 towards lower surface 224. In embodiments wherein the size of opening 218 or recess 220 decreases as it extends from upper surface 226 towards lower surface 224, the ratio of the size of the opening 218 at upper surface 226 to the size of the opening at the lower surface 224 is about 1.1 to 1.3.

Figure 8:
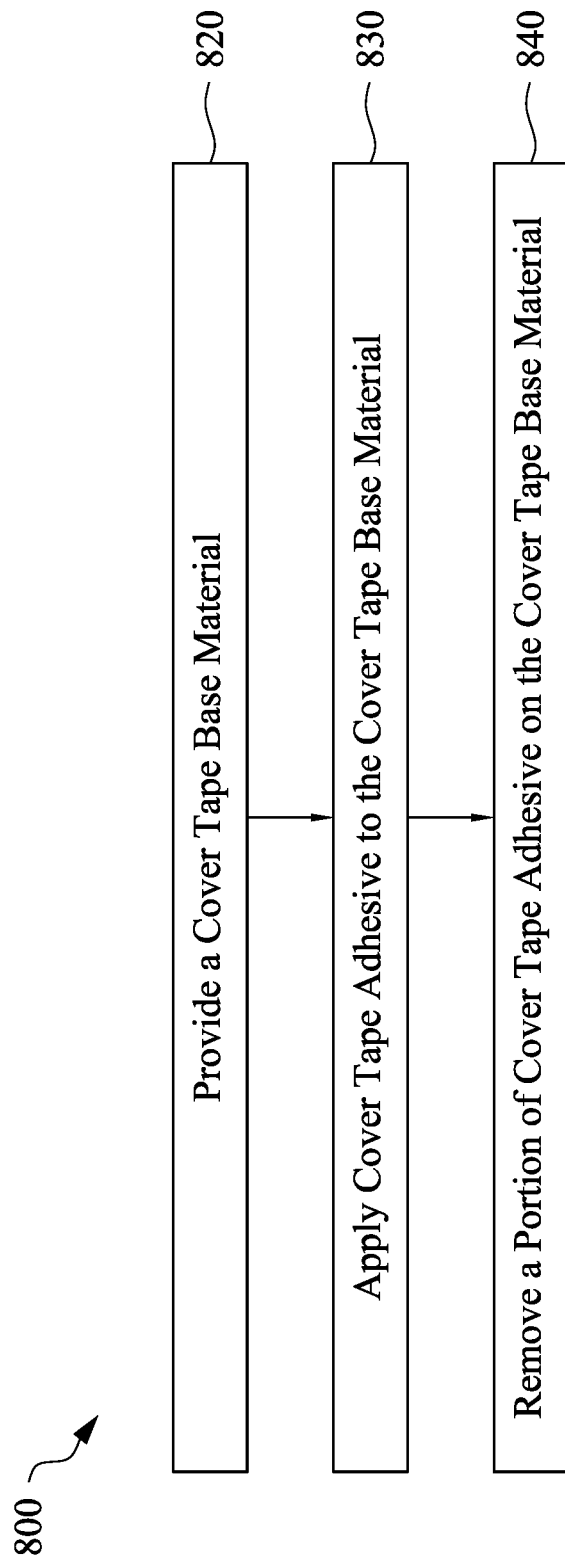
FIG. 8 illustrates a method in accordance with embodiments of the present disclosure.

Referring to FIG. 8, embodiments of the present disclosure include a method 800 for producing cover tapes useful in carrier tape systems in accordance with the present disclosure. In the illustrated method 800, a cover tape base material is provided at step 820. At step 830, a cover tape adhesive is applied to a surface of the cover tape base material. Portions of the cover tape adhesive applied to a surface of the cover tape base material are removed in order to define areas on the surface of the cover tape base material which are free of adhesive, e.g., non-adhesion areas. As discussed above, the portions of the cover tape adhesive can be removed by techniques analogous to photolithography or they can be removed by mechanical means, such as punching or similar techniques.

Figure 9:
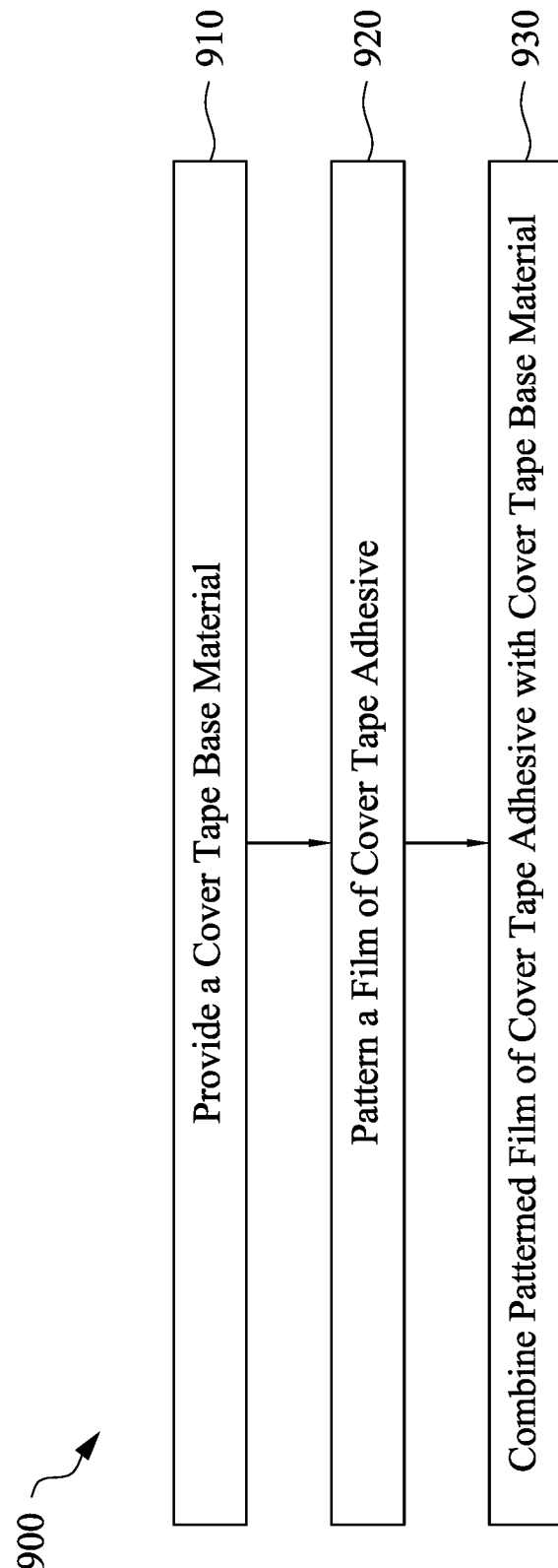
FIG. 9 illustrates a method in accordance with embodiments of the present disclosure.

Referring to FIG. 9, in accordance with other embodiments of the present disclosure, method 900 illustrates a method for providing a cover tape useful in carrier tape systems in accordance with the present disclosure. In the illustrated method 900 of FIG. 9, a cover tape base material is provided at step 910. A film of cover tape adhesive is patterned at step 922 to remove portions of the cover tape adhesive film, for example by punching or similar technique to remove portions of the film of cover tape adhesive. Alternatively, the film of cover tape adhesive may be patterned using techniques analogous to photolithography techniques or stenciling. At step 930, the resulting patterned film of cover tape adhesive is combined with the cover tape base material. The resulting combination is a cover tape which includes portions that are free of adhesive (non-adhesive areas) and portions that are not free of adhesive (adhesive areas).

Figure 10:
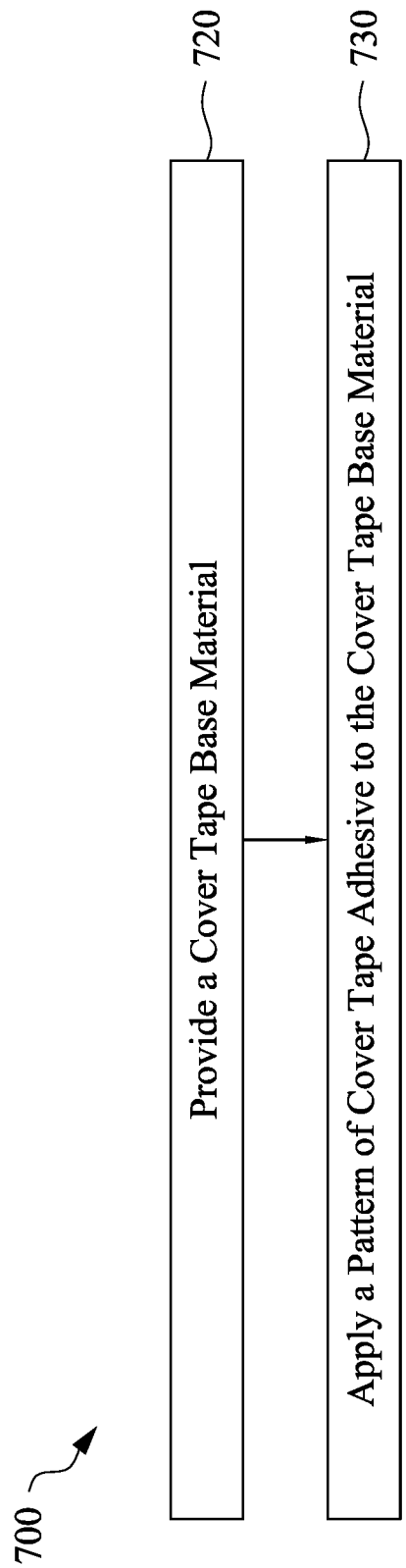
FIG. 10 illustrates a method in accordance with embodiments of the present disclosure.

Referring to FIG. 10, in accordance with other embodiments of the present disclosure, method 700 illustrates another method for providing a cover tape useful in carrier tape systems in accordance with the present disclosure. In the illustrated method 700 of FIG. 10, a cover tape base material is provided at step 720. At step 730, a pattern of cover tape adhesive is applied to the cover tape base material, for example by printing or stenciling a pattern of cover tape adhesive on the cover tape base material. The cover tape adhesive may be printed on the cover tape base material using inkjet printer techniques or the adhesive may be printed on the cover tape base material through a stencil comprising the desired pattern of adhesive. The resulting cover tape includes portions that are free of adhesive (non-adhesive areas) and portions that are not free of adhesive (adhesive areas).

Figure 11:
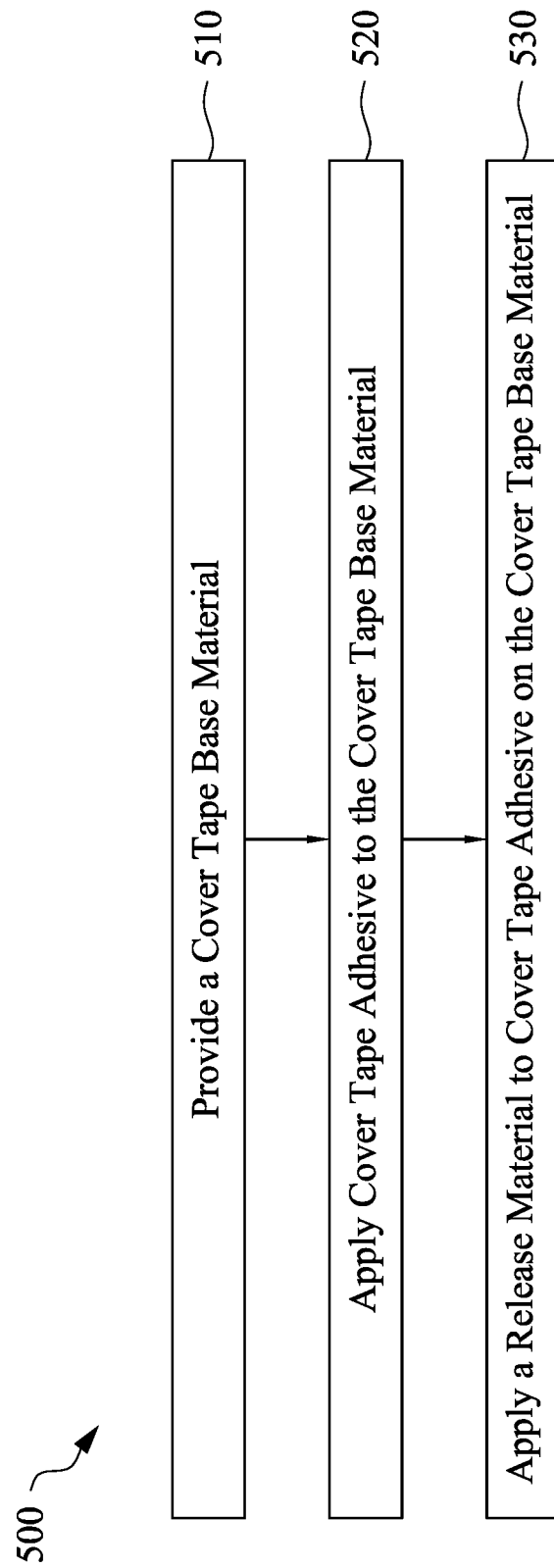
FIG. 11 illustrates a method in accordance with embodiments of the present disclosure.

Referring to FIG. 11, in accordance with other embodiments of the present disclosure, method 500 illustrates another method for providing a cover tape useful in carrier tape systems in accordance with the present disclosure. In the illustrated method 500 of FIG. 11, a cover tape base material is provided at step 510. At step 520, a cover tape adhesive is applied to a surface of the cover tape base material. A release material is applied to the cover tape adhesive at step 530. The release material is applied as a blanket film and then subsequently patterned to remove portions of the release material or the release material is applied in a pattern producing portions of the cover tape adhesive that are covered by the release material and portions of the cover tape material that are not covered by the release material. The release material can be applied using techniques similar to those described above with regard to applying the cover tape adhesive to the cover tape base material and can be patterned using techniques similar to those described above with regard to patterning the cover tape adhesive. The resulting cover tape includes non-adhesion areas where the release material is present and the cover tape is unable to adhere to a carrier tape and adhesion areas where the release material is not present and the cover tape is able to adhere to a carrier tape.

The methods described above with reference to FIGS. 8-11 relate to forming a carrier tape system whereby the non-adhesion areas in accordance with embodiments described herein are provided by a pattern of adhesive on a cover tape or a pattern of adhesive and release material on a cover tape. The present disclosure is not limited to providing non-adhesion areas using the methods described above with regard to FIGS. 8-11. In other embodiments of the present disclosure, a carrier tape system including non-adhesion areas is formed by providing a carrier tape substrate that includes the desired pattern of adhesive or desired pattern of adhesive covered by a release material on the carrier tape substrate. In other embodiments described above, a carrier tape system including non-adhesion areas is formed by providing openings or recesses in a carrier tape substrate and combining such carrier tape substrate with a cover tape that includes an adhesive layer.

Figure 12:
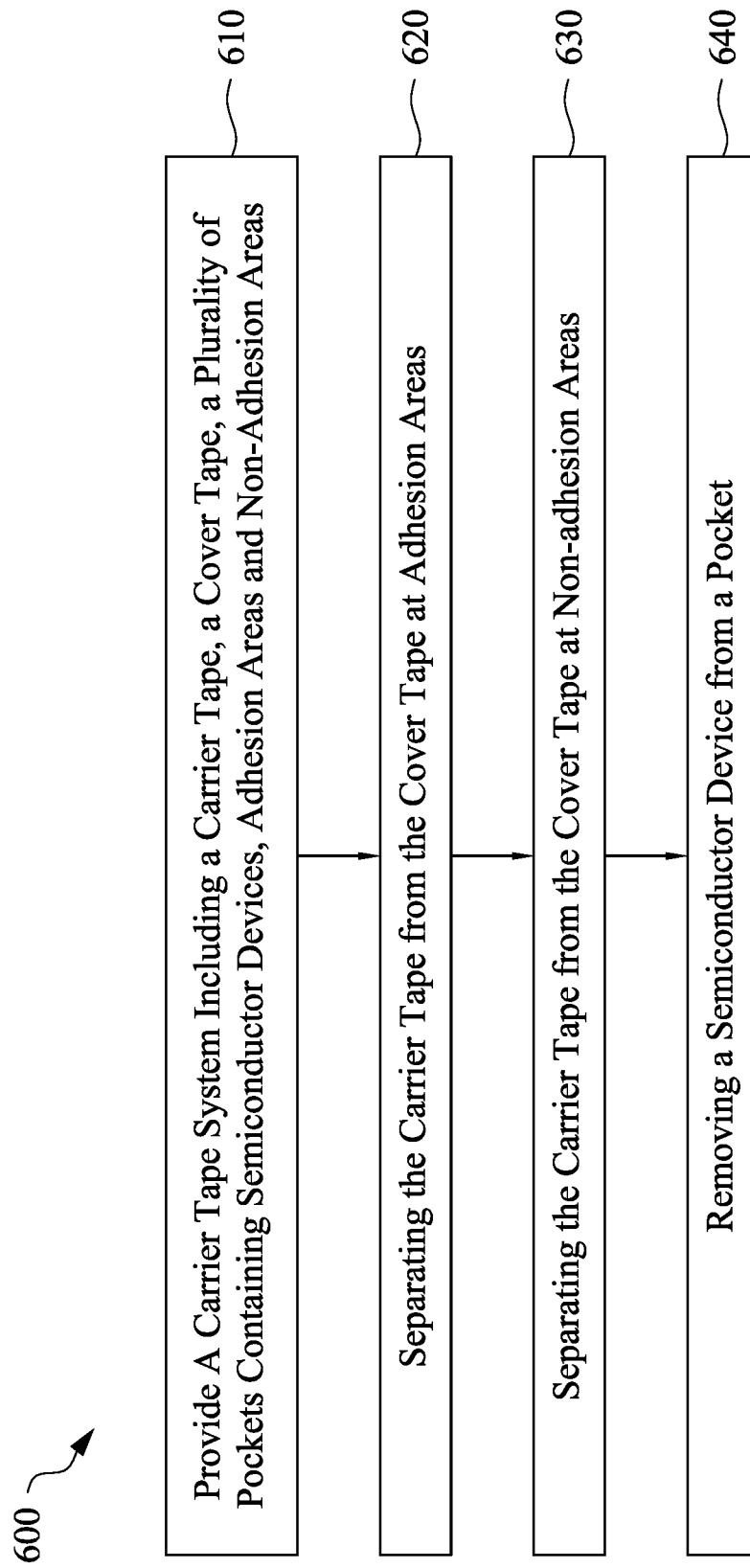
FIG. 12 illustrates a method in accordance with embodiments of the present disclosure.

Referring to FIG. 12, methods in accordance with the presently disclosed embodiments include a method 600, for supplying a semiconductor device to an apparatus, which in operation, removes the semiconductor device from a pocket of a carrier tape system. In accordance with the method 600, at step 610, a carrier tape system is provided. The carrier tape system includes a plurality of adhesion areas and non-adhesion areas. The carrier tape system also includes a carrier tape substrate which includes a plurality of pockets containing semiconductor devices. In some embodiments, the plurality of adhesion areas and non-adhesion areas are arranged in at least one row extending along a length of the carrier tape system between the plurality of pockets and a longitudinal edge of the carrier tape system. A cover tape is adhered to the carrier tape substrate by the plurality of adhesion areas. In accordance with method 600, at step 620, the carrier tape substrate is separated from the cover tape at an adhesion area. At step 630, the carrier tape substrate is separated from the cover tape at a non-adhesion area. At step 640, a semiconductor device is removed from a pocket. In accordance with some embodiments, steps 620 and 630 by repeated multiple times before one of the semiconductor devices is removed from a pocket. In subsequent steps (not illustrated), the removed semiconductor device is placed at a desired location.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments:

In a structure embodiment, a carrier tape system for semiconductor device includes a cover tape and a carrier tape substrate that includes a first edge and a second edge extending along a length of the carrier tape substrate. The carrier tape substrate includes a plurality of pockets located between the first edge of the carrier tape substrate and the second edge of the carrier tape substrate. The pockets are configured to accommodate the semiconductor device. The carrier tape substrate also includes a plurality of non-adhesion areas arranged in a first row along the length of the carrier tape substrate and a plurality of non-adhesion areas arranged in a second row along the length of the carrier tape substrate. The first row of non-adhesion areas is located on one side of the plurality of pockets and the second row of non-adhesion areas is located on a side of the plurality of pockets different from the side of the plurality of pockets where the first row of non-adhesion areas is located.

A carrier tape system embodiment of the present disclosure includes a cover tape and carrier tape substrate having a length. The carrier tape substrate further includes a plurality of pockets for semiconductor devices and a plurality of non-adhesion areas arranged in a row along the length of the carrier tape area on one side of the pockets. The carrier tape system includes a second plurality of non-adhesion areas is arranged in a second row along the length of the carrier tape and on a side of the pockets opposite from the side of the pockets where the first row of non-adhesion areas is arranged.

A method embodiment relates to a method for removing semiconductor devices from a pocket of a carrier tape. The method includes separating a cover tape from a carrier tape substrate. The carrier tape substrate having a width and a length, a plurality of pockets each containing at least one of the semiconductor devices, a plurality of non-adhesion areas arranged in a first row along the length of the carrier tape substrate and a plurality of non-adhesion areas arranged in a second row along the length of the carrier tape substrate. The first row of non-adhesion areas is located on one side of the plurality of pockets and the second row of non-adhesion areas is located on a side of the plurality of pockets different from the side of the plurality of pockets where the first row of non-adhesion areas is located. The method includes separating the cover tape from the carrier tape substrate at one or more of the plurality of non-adhesion areas and separating the cover tape from the carrier tape substrate at one or more of a plurality of adhesion areas. With the cover tape removed, at least one of the semiconductor device is removed from the plurality of pockets.

A method embodiment relates to a method for removing a semiconductor devices from a pocket of a carrier tape. The method includes separating the cover tape from the carrier tape substrate, wherein the carrier tape substrate includes a plurality of non-adhesion areas between a plurality of pockets for semiconductor devices and a longitudinal edge of the carrier tape substrate. The method further include separating the cover tape from the carrier tape substrate at one or more of a plurality of—adhesion areas, the adhesion areas being arranged between the non-adhesion areas and between the plurality of pockets for semiconductor devices and the longitudinal edge of the carrier tape substrate.

The invention claimed is:

1. A method for removing semiconductor devices from a pocket of a carrier tape, the method comprising:
providing a cover tape on a carrier tape substrate, the carrier tape substrate having a width and a length, a plurality of pockets each containing at least one of the semiconductor devices, a first plurality of non-adhesion areas arranged in a first row along the length of the carrier tape substrate and a second plurality of non-adhesion areas arranged in a second row along the length of the carrier tape substrate, the first row of non-adhesion areas located on one side of the plurality of pockets and the second row of non-adhesion areas located on a side of the plurality of pockets different from the side of the plurality of pockets where the first row of non-adhesion areas is located, each of the first plurality of non-adhesion areas including an opening through the carrier tape substrate;
separating the cover tape from the carrier tape substrate at one or more of the plurality of non-adhesion areas;
separating the cover tape from the carrier tape substrate at one or more of a plurality of adhesion areas; and
removing the at least one semiconductor device from the plurality of pockets.

2. The method of claim 1, wherein the separating the cover tape from the carrier tape substrate at one or more of the plurality of non-adhesion areas includes separating a portion of the cover tape that overlaps one of the openings through the carrier tape substrate.

3. The method of claim 1, wherein the first row of non-adhesion areas extends parallel to the length of the carrier tape substrate.

4. The method of claim 1, wherein the openings are free of adhesive.

5. The method of claim 1, wherein the plurality of adhesion areas are aligned with the first plurality of non-adhesion layers of the first row.

6. The method of claim 1, wherein the semiconductor devices are surface mount devices.

7. The method of claim 1, wherein the separating the cover tape from the carrier tape substrate at one or more of the plurality of non-adhesion areas includes separating the cover tape from the first plurality of non-adhesion areas of the first row.

8. The method of claim 1, wherein the separating the cover tape from the carrier tape substrate at one or more of the plurality of non-adhesion areas includes causing the carrier tape substrate to vibrate.

9. A method for removing semiconductor devices from a pocket of a carrier tape, the method comprising:
providing a cover tape on a carrier tape substrate, the carrier tape substrate including a first edge extending along a length of the carrier tape substrate, a second edge extending along the length of the carrier tape substrate, a plurality of pockets between the first edge and the second edge, each pocket containing at least one of the semiconductor devices, and a first plurality of non-adhesion areas arranged in a first row along the length of the carrier tape substrate, each of the first plurality of non-adhesion areas including an opening through the carrier tape substrate;
separating the cover tape from the carrier tape substrate at one or more of the first plurality of non-adhesion areas;
separating the cover tape from the carrier tape substrate at one or more of a plurality of adhesion areas; and
removing the at least one semiconductor device from one of the plurality of pockets.

10. The method of claim 9, wherein the semiconductor devices are surface mount devices.

11. The method of claim 9, wherein the separating the cover tape from the carrier tape substrate includes causing the carrier tape substrate to vibrate.

12. The method of claim 9, wherein the separating the cover tape from the carrier tape substrate at one or more of the first plurality of non-adhesion areas includes separating a portion of the cover tape that overlaps the openings through the carrier tape substrate.

13. The method of claim 9, wherein the carrier tape substrate includes a second plurality of non-adhesion areas arranged in a second row along the length of the carrier tape substrate and each of the second plurality of non-adhesion areas including an opening through the carrier tape substrate and further comprising separating the cover tape from the carrier tape substrate at one or more of the second plurality of non-adhesion areas of the carrier tape substrate.

14. The method of claim 9, wherein the carrier tape substrate includes a second plurality of non-adhesion areas arranged in a second row along the length of the carrier tape substrate and each of the second plurality of non-adhesion areas including a recess in the carrier tape substrate, a portion of the carrier tape substrate free of adhesive or a portion of the carrier tape substrate that includes an adhesive with a release material on the adhesive and further comprising separating the cover tape from the carrier tape substrate at one or more of the second plurality of non-adhesion areas of the carrier tape substrate.

15. A method for removing semiconductor devices from a pocket of a carrier tape, the method comprising:
providing a cover tape on a carrier tape substrate, the carrier tape substrate including a first edge extending along a length of the carrier tape substrate, a second edge extending along the length of the carrier tape substrate, a plurality of pockets between the first edge and the second edge, each pocket containing at least one of the semiconductor devices, and a first plurality of non-adhesion areas arranged in a first row along the length of the carrier tape substrate, each of the first plurality of non-adhesion areas including a recess in the carrier tape substrate, more than one of the first plurality of non-adhesion areas being adjacent each of the plurality of pockets;
separating the cover tape from the carrier tape substrate at one or more of the first plurality of non-adhesion areas;
separating the cover tape from the carrier tape substrate at one or more of a plurality of adhesion areas; and
removing the at least one semiconductor device from one of the plurality of pockets.

16. The method of claim 15, wherein the semiconductor devices are surface mount devices.

17. The method of claim 15, wherein the separating the cover tape from the carrier tape substrate includes causing the carrier tape substrate to vibrate.

18. The method of claim 15, wherein the separating the cover tape from the carrier tape substrate at one or more of the first plurality of non-adhesion areas includes separating a portion of the cover tape that overlaps the recesses in the carrier tape substrate.

19. The method of claim 15, wherein the carrier tape substrate includes a second plurality of non-adhesion areas arranged in a second row along the length of the carrier tape substrate and each of the second plurality of non-adhesion areas including a recess in the carrier tape substrate and further comprising separating the cover tape from the carrier tape substrate at one or more of the second plurality of non-adhesion areas of the carrier tape substrate.

20. The method of claim 15, wherein the carrier tape substrate includes a second plurality of non-adhesion areas arranged in a second row along the length of the carrier tape substrate and each of the second plurality of non-adhesion areas including an opening through the carrier tape substrate, a portion of the carrier tape substrate free of adhesive or a portion of the carrier tape substrate that includes an adhesive with a release material on the adhesive and further comprising separating the cover tape from the carrier tape substrate at one or more of the second plurality of non-adhesion areas of the carrier tape substrate.

* * * * *